(12) United States Patent
Dhananjay et al.

(10) Patent No.: US 10,841,026 B2
(45) Date of Patent: Nov. 17, 2020

(54) SYSTEM, METHOD AND COMPUTER-ACCESSIBLE MEDIUM FOR SIMULATION AND EMULATION OF WIRELESS CLUSTER AND/OR TAPPED DELAY LINE MODELS

(71) Applicants: Aditya Dhananjay, Brooklyn, NY (US); Sundeep Rangan, Jersey City, NJ (US); Dennis Shasha, New York, NY (US)

(72) Inventors: Aditya Dhananjay, Brooklyn, NY (US); Sundeep Rangan, Jersey City, NJ (US); Dennis Shasha, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 16/297,131

(22) Filed: Mar. 8, 2019

(65) Prior Publication Data

US 2019/0280791 A1   Sep. 12, 2019

Related U.S. Application Data

(60) Provisional application No. 62/640,365, filed on Mar. 8, 2018.

(51) Int. Cl.
*H04B 17/391*   (2015.01)
*H03H 17/06*   (2006.01)
(Continued)

(52) U.S. Cl.
CPC ......... *H04B 17/3912* (2015.01); *H03H 17/06* (2013.01); *H04B 7/0456* (2013.01); *H04B 7/0617* (2013.01)

(58) Field of Classification Search
CPC .............. H04B 17/3912; H04B 7/0456; H04B 7/0617; H03H 17/06
See application file for complete search history.

(56) References Cited

U.S. PATENT DOCUMENTS

| 2008/0114580 A1* | 5/2008 | Chin ................... H04B 7/0682 703/13 |
| 2013/0006601 A1* | 1/2013 | Mlinarsky .......... H04B 17/0087 703/23 |

(Continued)

*Primary Examiner* — Yuwen Pan
*Assistant Examiner* — Angelica M Perez
(74) *Attorney, Agent, or Firm* — Hunton Andrews Kurth LLP

(57) ABSTRACT

An exemplary device for emulating a wireless channel(s) can be provided, which can include, for example, a first communication interface configured to receive a first data signal(s) from a transmitter unit(s), a hardware processor configured to receive the first data signal(s) from the first communication interface, and generate a second data signal(s) by modifying the first data signal(s) based on a test(s) being performed on the transmitter unit(s), and a second communication interface configured to receive the second data signal(s) from the hardware processor, and transmit the second data signal(s) to a receiver unit(s). A control interface can be included, which can be configured to receive a control signal(s) from the transmitter unit(s) or the receiver unit(s) and provide the control signal(s) to the hardware processor for determining the second data signal(s).

19 Claims, 16 Drawing Sheets

(51) Int. Cl.
*H04B 7/06* (2006.01)
*H04B 7/0456* (2017.01)

(56) References Cited

U.S. PATENT DOCUMENTS

2014/0024318 A1* 1/2014 Sevindik ............... H04W 24/06
455/67.14
2017/0019154 A1* 1/2017 Reed .................... H04B 7/0413

* cited by examiner

The wireless channel has L clusters, and K sub-paths per cluster

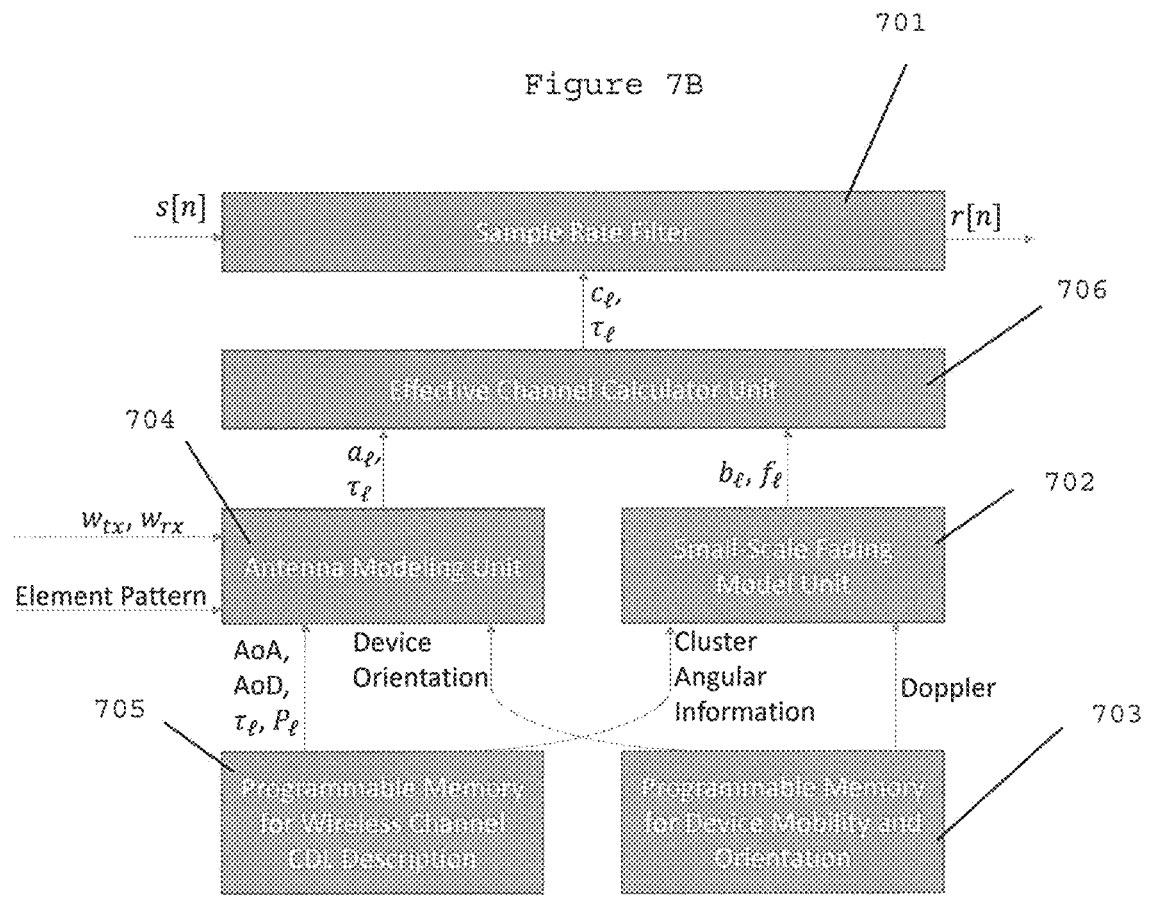

SYSTEM, METHOD AND COMPUTER-ACCESSIBLE MEDIUM FOR SIMULATION AND EMULATION OF WIRELESS CLUSTER AND/OR TAPPED DELAY LINE MODELS

CROSS-REFERENCE TO RELATED APPLICATION(S)

This application relates to and claims priority from U.S. Patent Application No. 62/640,365, filed on Mar. 8, 2018, the entire disclosure of which is incorporated herein by reference.

FIELD OF THE DISCLOSURE

The present disclosure relates generally to wireless cluster and tapped delay line models, and more specifically, to exemplary embodiments of exemplary system, method and computer-accessible medium for an accelerated simulation and emulation of wireless cluster and/or tapped delay line models.

BACKGROUND INFORMATION

Simulation and emulation of multiple-in-multiple-out ("MIMO") channels are important tools for evaluating wireless systems. In simulation, the wireless devices under test and the channel between them are mathematically modeled in a computer program. Simulation is low-cost, and is often performed prior to the building of the wireless devices to quickly evaluate different design options. Typically, a simulation of a wireless channel is not performed in real-time.

In contrast, the emulation uses the actual wireless devices under test ("DUTs"). The DUTs connect to an emulator, which is a programmable device that simulates a wireless channel. In contrast to performing over-the-air ("OTA") tests of the wireless devices, the emulation can be performed at lower cost and experimentation time and can be easily configured to model a wide range of channel models, some of which can be difficult to reproduce in an actual OTA test. In addition, the results are reproducible. Both simulators and emulators have been used extensively for many years in the design, validation, and test of 2G, 3G, and 4G wireless systems. Importantly, emulators typically operate in a substantively real-time manner.

Emerging wireless technologies (e.g., millimeter wave 5G cellular, and sub-6 GHz 5G massive-MIMO cellular) can use large numbers of antennas and very high sample rates. In general, the computational cost of emulation and simulation scales linearly with the product of the number of the antennas and the bandwidth. As a result, the computational costs for emulation and simulation can be high and even prohibitive using conventional procedures. In addition, the computational cost of traditional emulation or simulation methods likely scales linearly with the total number of rays in the channel models. Channel models with large numbers of path clusters, each with a large number of sub-paths per cluster, can further increase the computational burden.

Accordingly, there is a need for providing lower cost computational solutions for emulating wideband channels with large numbers of antennas and sub-paths.

to that end, it may be beneficial to provide an exemplary system, method and computer-accessible medium for fast simulation and emulation of wireless cluster and/or tapped delay line models which can overcome at least some of the deficiencies described herein above.

SUMMARY OF EXEMPLARY EMBODIMENTS

An exemplary device for emulating a wireless channel(s) can be provided, which can include, for example, a first communication interface configured to receive a first data signal(s) from a transmitter unit(s), a hardware processor configured to receive the first data signal(s) from the first communication interface, and generate a second data signal(s) by modifying the first data signal(s) based on a test(s) being performed on the transmitter unit(s), and a second communication interface configured to receive the second data signal(s) from the hardware processor, and transmit the second data signal(s) to a receiver unit(s). A control interface can be included, which can be configured to receive a control signal(s) from the transmitter unit(s) or the receiver unit(s) and provide the control signal(s) to the hardware processor for determining the second data signal(s).

In some exemplary embodiments of the present disclosure, An antenna modeling unit(s) can be included, which can be configured to determine, based on the control signal(s), (i) one or more cluster angles of arrival from the transmitter unit(s) or (ii) one or more cluster angles of departure for the receiver unit(s). The control signal(s) can include (i) beamforming weights, (ii) precoding matrices for a plurality of antennas, (iii) a gain control, or (iv) polarization for the plurality of antennas. A programmable memory apparatus(es) can be included, which can be configured to store particular information thereon related to (i) a cluster delay line between the transmitter unit(s) and the receiver unit(s) to emulate, or (ii) a tapped delay line between the transmitter unit(s) and the receiver unit(s) to emulate. The particular information can include of (i) a signal delay, (ii) an angular spread, (iii) a central angle of arrival, or (iv) a central angle of departure.

In certain exemplary embodiments of the present disclosure, the particular information can include (i) a placement of an antenna(s), (ii) an orientation of the antenna(s), or (iii) a radiated beam pattern of the antenna(s). The particular information can include (i) a motion or (ii) an orientation of (i) the transmitter unit(s) or (ii) the receiver unit(s). The particular information can include (i) a channel impulse response, (ii) a mobility of the transmitter unit(s) or the receiver unit(s), or (iii) a carrier frequency of the wireless channel. A fading computing unit(s) can be included, which can be configured to determine a Doppler shift for each cluster of signals between the transmitter unit(s) and the at receiver unit(s). The fading computing unit(s) can be configured to determine the Doppler shift based (i) an angular speed within each cluster of signals, (ii) a motion of the transmitter unit(s) or the receiver unit(s), or (iii) an orientation of the transmitter unit(s) or the receiver unit(s).

In some exemplary embodiments of the present disclosure, the first data signal(s) can have a form of (i) a time-domain analog baseband, (ii) a time-domain digital baseband, (iii) a time-domain intermediate frequency, (iv) a time-domain radio frequency, or (v) a frequency-domain digital baseband, and the second data signal(s) can have a form of one of (i) the time-domain analog baseband, (ii) the time-domain digital baseband, (iii) the time-domain intermediate frequency, (iv) the time-domain radio frequency, or (v) the frequency-domain digital baseband. The hardware processor can be configured to generate the second data signal(s) using a sample filter(s). The sample filter(s) can include a plurality of programmable finite impulse response (FIR) filters. The hardware processor can be further configured to program the plurality of programmable FIR filter to emulate a particular type(s) of channel. The particular type(s) of channel can include (i) a Single input single output, (ii) a Single input multiple output, (iii) a Multiple input single output, or (iv) a Multiple input Multiple output.

Additionally, an exemplary device for emulating a wireless channel(s) can be provided, which can include, for example, a first communication interface configured to receive a first data signal(s) from a transmitter unit(s), a programmable memory apparatus(es) configured to store particular information related to a cluster of signals, a programmable sample filter(s) providing filter data associated with the first data signal(s), a hardware processor configured to receive (i) first data signal(s) from the first communication interface, and (ii) the particular information, and generate a second data signal(s) by modifying the first data signal(s) based on (i) a test(s) being performed on the transmitter unit(s), and (ii) the filter data provided by the programmable sample filter(s), a second communication interface configured to receive the second data signal(s) from the hardware processor, and transmit the second data signal(s) to a receiver unit(s). The hardware processor can be further configured to program the programmable sample filter(s) to emulate a particular type(s) of channel prior to generating the second data signal(s).

An exemplary system, method and computer-accessible medium for emulating a wireless channel(s) can include, for example, receiving a first data signal(s) from a transmitter unit(s), programming a programmable filter(s) to generate filter data based on channel information related to the transmitter unit(s), generating a second data signal(s) by modifying the first data signal(s) based on (i) a test(s) being performed on the transmitter unit(s), and (ii) the filter data generated by the programmed sample filter(s), and transmitting the second data signal(s) to a receiver unit(s). The generating of the second data signal(s) can be further based on information related to a cluster of signals stored in a programmable memory.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 7B is a further exemplary block diagram of an exemplary apparatus for implementing the exemplary emulation system according to an exemplary embodiment of the present disclosure;

Figure 1:
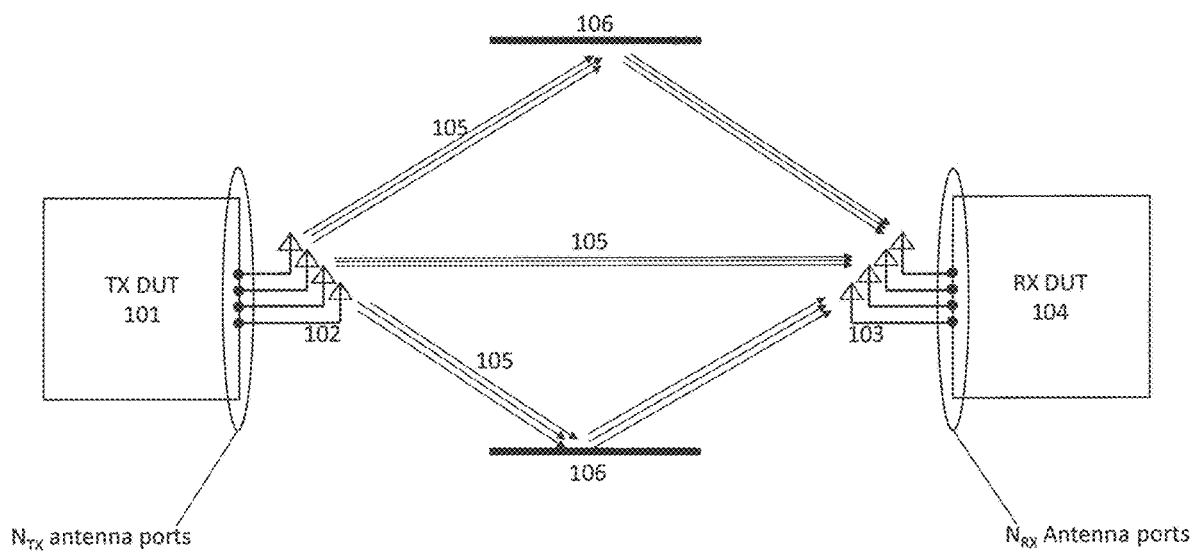
FIG. 1 is an exemplary diagram of a wireless channel between a transmitter device and a receiver device according to an exemplary embodiment of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

FIG. 1 shows an exemplary diagram of a wireless channel provided between a transmitter device and a receiver device according to an exemplary embodiment of the present disclosure. As shown in FIG. 1, the wireless channel provided between a transmitter ("TX") device 101, has antenna elements 102 and a receiver ("RX") wireless device 104, has antenna elements 103, the combination of which is illustrated as a cluster-delay-line ("CDL") model or tapped delay line ("TDL") model. In such exemplary models, L clusters 105 can be provided between the transmitter and receiver, and each cluster can have K sub-paths. Multiple clusters can be provided in the wireless channel due to various reflectors and objects 106 in the environment. Each cluster can be described by various parameters that can include the gain, Doppler, delay, and angles of arrival/departure, and angular spread.

Simulation or emulation of a wireless CDL/TDL model can be performed as follows: Let $N_{tx}$ and $N_{rx}$ denote the number of antennas on the transmitter and receiver device. One example of simulation or emulation can be to represent the transmitted signal as a sequence x[n] of complex baseband vectors of dimension $N_{tx}$, where n can be the sample index, or equivalently, time. The received signal y[n] can also be a complex baseband vector of size $N_{rx}$. x[n] and y[n] can be the data signals to differentiate them from control signals such as beamforming coefficient weights and gain controls that are described below. The wireless channel between the transmitter and the receiver can be used for the transformation of the data signals x[n] to y[n]. In a CDL/TDL model, the RX data signal y[n] can be given by, for example:

$$y[n] = \sum_{\ell=1}^{L} \sum_{k=1}^{K} \sqrt{\frac{P_\ell}{K}} e^{-i2\pi f_{\ell k} n} u^{rx}(\theta_{\ell k}^{rx})[u^{tx}(\theta_{\ell k}^{tx}) \cdot x[n-\tau_\ell]], \quad (1)$$

where the channel can be described by L clusters, with K sub-paths per cluster. For each sub-path, $f_{lk}$ can be the discrete-time Doppler shift, $P_l$ can be the normalized power for the $l^{th}$ cluster, and $\tau_l$ can be the delay on the $n^{th}$ cluster. $\theta_{lk}^{rx}$ can denote the angle of arrival ("AoA") of the $k^{th}$ sub-path in the $l^{th}$ cluster, and $u^{rx}(\theta_{lk}^{rx})$ can be the "spatial signature" of the same path. The spatial signature can be a complex vector of size $N_{rx}$ representing the RX array response to a plane wave with an AoA $\theta_{lk}^{rx}$. The AoA $\theta_{lk}^{rx}$ can either be a single angle (e.g., horizontal or vertical) for two-dimensional ("2D") models, or an angle pair (e.g. horizontal and vertical, or azimuth and zenith/elevation) for three-dimensional ("3D") models. Symmetrically, the angle of departure ("AoD") of the $k^{th}$ sub-path in the $l^{th}$ cluster can be given by $\theta_{lk}^{tx}$, and, the "spatial signature" of this sub-path can be given by $u^{tx}(\theta_{lk}^{tx})$; this can be a complex vector of size $N_{tx}$. These angles of arrival and departure can also be specified in polar coordinates. The delay $\tau_l$ can be the same for all K sub-paths of the cluster l∈L. However, if the cluster has a resolvable delay spread (e.g., the sub-paths have different discrete-time delays), then that cluster can be divided into smaller clusters, each having the same delay.

The exemplary wireless channel between the transmitter and receiver (e.g., from Eq. (1) above) can be emulated or simulated, to perform testing of the transmitter and/or receiver DUTs. While the computational procedures described herein can be applied to both simulation (e.g., non-real-time) and emulation (e.g., real-time) systems, the computational cost can be more relevant for emulation because the real-time processing requirement can place more stringent limits on the computational cost. The exemplary emulator can accept as an input the data signal vector x[n] and can produce as an output the data signal vector y[n], the transformation being dependent on the wireless channel characteristics being emulated.

The transmitted data signals x[n] and/or received data signals y[n] can be in intermediate frequency ("IF") or radio frequency ("RF"). There can be an equivalence between the baseband, IF, and RF signals, and the procedures used to emulate the wireless channel can therefore operate over baseband, IF, or RF signals. Further, additional conversion stages between IF/RF and baseband can be utilized to apply digital signal processing procedures. The transmitted and/or received data signals can also be represented in frequency-domain, or an alternate transform domain. The equivalence of the data signals can also be present across alternate domains.

Exemplary Sample Rate Operation:

The filtering operations can be provided that can be performed on each sample n. The sample rate of future millimeter wave ("mmWave") systems can be 1 GHz or larger, so the computational requirements (e.g., expressed in the number of multiplications) needed to be performed at this sample rate can be an important consideration. The hardware that is utilized to perform the emulation can be dominated by the computational cost of this sample rate filtering. These filtering operations can typically be performed using finite impulse response ("FIR") filters with programmable tap coefficients.

Doppler Update Operations:

Exemplary operations can be provided which can be associated with the changes in the phase terms $e^{-i2\pi f_{lk} n}$. The Doppler frequency shifts $f_{lk}$ can typically be about 20 kHz or less for most mm Wave carrier frequencies and mobile speeds. These terms can be updated much less frequently than the sample rate in most systems.

Exemplary Beamforming and Directional Change Operations:

Such exemplary operations can be operations associated with changes in the angles $(\theta_{lk}^{tx})$ and $(\theta_{lk}^{rx})$ (e.g., spatial signatures $u^{tx}(\theta_{lk}^{tx})$ and $u^{rx}(\theta_{lk}^{rx})$) as well as beamforming/pre-coding weights applied to the input or output samples. Since the directions of the path change only with large-scale geometry, the directions can also change at a much slower rate than the sample rate. In real-time emulation, it can be beneficial to update the beamforming/pre-coding weights with very low latency. Specifically, the time to emulate a beamforming change can be small relative to the total beamforming control loop time. The beamforming weights can be dependent on which users can be selected in the scheduling procedures. In 5G systems that seek sub-millisecond latency, the beamforming switching time can be extremely small (e.g., in the order of microseconds or quicker) in order to maintain substantially real-time operation.

Exemplary Sample Rate Operation:

On each sample n, Eq. (1) can be exemplary implemented in the emulator. The computation $[u^{tx}(\theta^{tx}_{lk}) \cdot x[n-T_l]]$ can be performed first at the cost of $N_{tx}$ complex multiplications, for which the result can be a complex scalar. This result can then be multiplied with $$\sqrt{\frac{P_\ell}{K}}$$

and then with $e^{-i2\pi f_{lk}n}$, at a cost of another 2 complex multiplications. Note that the complex exponential can be generated by a rotating complex phasor. This result can then be multiplied with $u^{rx}(\theta_{lk}^{rx})$ at a cost of $N_{rx}$ complex multiplications. These ($N_{tx}+N_{rx}+2$) complex multiplications can be repeated for each of the LK sub-paths. The total computational cost can therefore be $O(LK(N_{tx}+N_{rx}+2))$ complex multiplications to be performed on each sample n. This order of performing the calculations (e.g., as described above) can be re-arranged, and can be performed in other orders as well, thereby maintaining the same computational cost as measured in number of multiplications needed on each sample n.

Exemplary Directional/Spatial Change Operation:

On any change in the orientation of the TX/RX antennas, or under a change in the underlying channel, the spatial signatures $u^{rx}(\theta_{lk}^{rx})$ and/or $u^{tx}(\theta_{lk}^{tx})$ can be re-computed or otherwise determined. Additionally, all the Doppler shifts $f_{lk}$ can be updated. The computational cost of performing these computations can be a total of, e.g., $O(KL(N_{rx}+N_{tx}))$, as measured in the number of multiplications. This operation can take place very infrequently—only when the underlying channel changes or when the orientation of the devices change. In an exemplary emulation scenario, the orientations or underlying channel changes very infrequently, relative to the sample rate of the emulator.

A faster implementation can be performed by emulating the channel along a single beamforming direction at the transmitter and/or receiver. The internal structure of the transmitter and receiver devices that operate using a large number of antenna elements can be examined.

Figure 2:
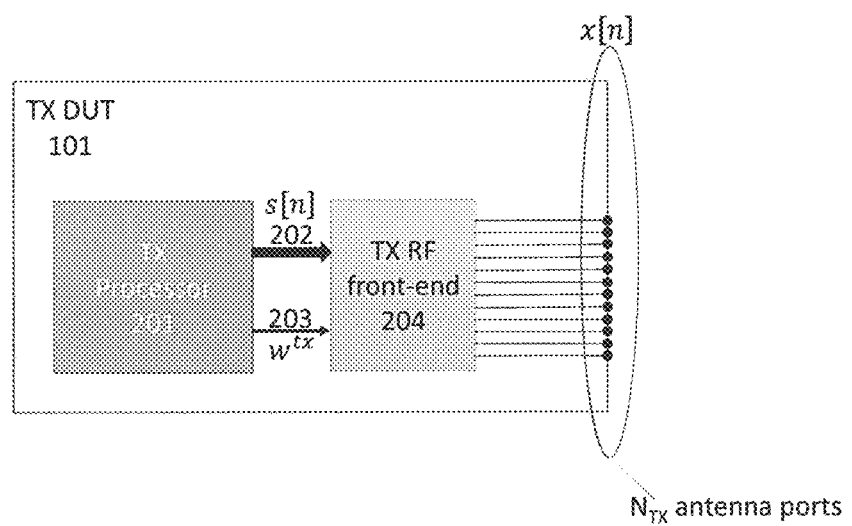
FIG. 2 is an exemplary diagram illustrating an exemplary structure of the exemplary transmitter device according to an exemplary embodiment of the present disclosure.

FIG. 2 shows an exemplary diagram illustrating the structure of the exemplary transmitter device 101 according to an exemplary embodiment of the present disclosure. As shown in FIG. 2, the exemplary transmitter device can include a processor 201 and an RF front-end 204. The processor 201 can transmit the pre-beamformed data signal 202 (s [n]) and the beamforming coefficients (e.g., the control signal) 203 ($w^{tx}$) to the RF front-end. Data signal 202 and control signal 203 can have the following exemplary structure(s):

Data Signal 202
(i) Analog beamforming: single stream
(ii) hybrid beamforming: $m_{tx}$—parallel streams ($m_{tx}<N_{tx}$)
(iii) Digital beamforming: $N_{TX}$ parallel streams
(iv) basedband I/Q, IF or RF
Control Signal 203
(i) Analog beamforming: beamforming vector
(ii) Hybrid beamforming: beamforming matrix The beam-forming RF front end 204 can apply the beamforming coefficients 203 to the signal 202 to generate the post-beamformed data signals x[n] that can then be routed to the antenna ports or antenna elements. If the pre-beamformed signal at the transmitter is a scalar s [n] and the beamforming vector is $w^{tx}$, then the post-beamformed signal can be mathematically represented by: $x[n]=w^{tx}s[n]$. The pre-beamformed data signal s[n] can be either in analog/digital baseband, IF, or RF; if this data signal can be in baseband or IF, then the RF front-end 204 performs the additional step of up-conversion to RF.

Figure 3:
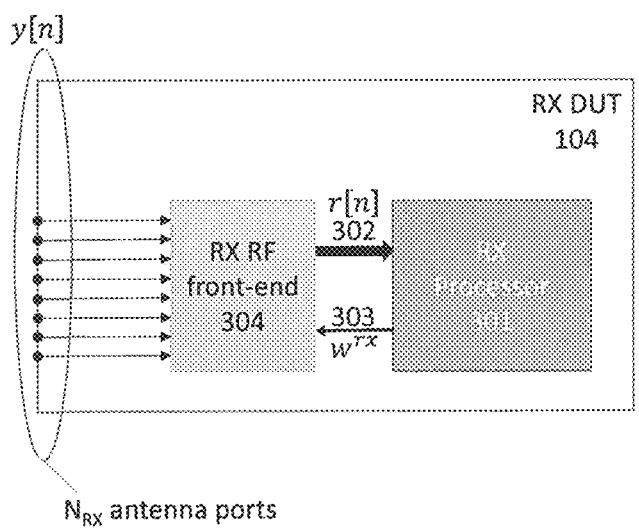
FIG. 3 is an exemplary diagram illustrating an exemplary structure of the exemplary receiving device according to an exemplary embodiment of the present disclosure.

FIG. 3 shows an exemplary diagram illustrating the structure of the exemplary receiving device 104 according to an exemplary embodiment of the present disclosure. As shown in FIG. 3, the receiving device 104 can include a processor 301 and a RF front-end 304. The RF front-end can receive the pre-beamformed data signal y[n] from the antenna elements or antenna ports and apply the beamforming coefficients (e.g., the control signal) 303 ($w^{rx}$) to it, which can result in the post-beamformed data signal 302 (r[n]). If the received pre-beamformed data signal vector can be y[n] and the beamforming vector can be $w^{rx}$, then the post-beamformed data signal can be a scalar given by: $r[n]=w^{rx}y[n]$. The data signal 302 (r[n]) can be in analog/digital baseband, IF, or RF. In the case that r[n] can be in baseband or IF, the front-end 304 can perform an additional down-conversion step from RF to baseband or IF. The data signal 302 and the control signal 303 can have the following exemplary structure(s):

Data Signal 302
(i) Analog beamforming: single stream
(ii) hybrid beamforming: $m_{rx}$ parallel streams ($m_{rx}<N_{rx}$)
(iii) Digital beamforming: $N_{RX}$ parallel streams
(iv) basedband I/Q, IF or RF
Control Signal 303
(i) Analog beamforming: beamforming vector
(ii) Hybrid beamforming: beamforming matrix An exemplary benefit in emulating along a given set of TX/RX beamforming directions can be that the emulator performs the emulation of not only the wireless channel, and also of the beamforming operations on the TX/RX devices under test.

Figure 4:
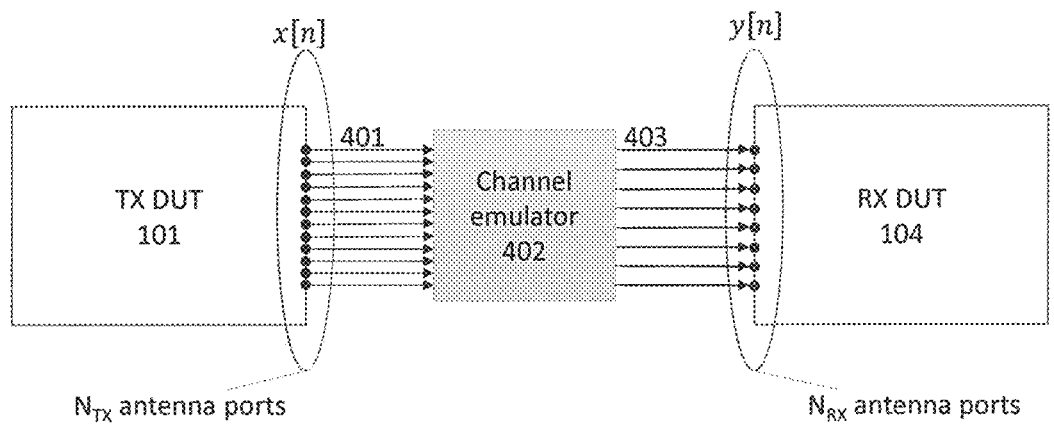
FIG. 4 is an exemplary diagram of an exemplary emulator according to an exemplary embodiment of the present disclosure.

FIG. 4 shows an exemplary diagram of an exemplary emulator according to an exemplary embodiment of the present disclosure. The exemplary emulator shown in FIG. 4 can accept signals 401 from the exemplary transmitter device 101 over cables; it can then modify the signal in accordance with a programmable channel characteristic; and finally, it can send the resulting signals 403 to the exemplary receiver device 104 over cables. Exemplary signal(s) 401 can have $N_{TX}$ parallel streams, and exemplary signal(s) 403 can have $N_{RX}$ parallel streams. An exemplary channel emulator 402 can be used to implement Eq. (1) above.

Providing these exemplary beamforming equations into Eq. (1) and performing simplifying calculations can produce, for example, the following:

$$r[n] = \sum_{\ell=1}^{L}\sum_{k=1}^{K} \sqrt{\frac{P_\ell}{K}}\, e^{-i2\pi f_{\ell k} n} \alpha_{lk} s[n-\tau_\ell] \quad (2)$$

with beamforming gains, the following can be produced:

$$\alpha_{lk}=\alpha_{lk}^{rx}\alpha_{lk}^{tx}, \alpha_{kl}^{rx}=w^{rx}\cdot u^{rx}(\theta_{lk}^{rx}), \alpha_{kl}^{tx}=w^{tx}\cdot u^{tx}(\theta_{lk}^{tx}) \quad (3)$$

Exemplary Sample Rate Operation:

Eq. (2) can be implemented on each sample n in the emulator. The exemplary emulator can accept as an input the pre-beamformed data signal s[n], and produce as an output the post-beamformed data signal r[n]. For each term in the summation, three complex multiplications can be needed. The complex exponential can be generated by a rotating complex phasor. Since this exemplary computation can be repeated for each of the LK sub-paths, the total cost can therefore be O(3LK); since constant multiplicative terms in asymptotic computational cost can typically be ignored, this computational cost can be written as O(LK). This can represent a significant savings over the full MIMO emulation described earlier. Specifically, this computational cost can be independent of the number of antennas $N_{tx}$ and $N_{rx}$ at the transmitter and receiver devices, respectively. If the Doppler frequencies can be small, the complex exponential in Eq. (2) can be pre-combined with $\alpha_{lk}$ for each term in the summation, and then updated only when the Doppler-related phases change. Further, the scaling factor $$\sqrt{\frac{P_\ell}{K}}$$

can also be combined with $\alpha_{lk}$ for each term in the summation, thereby further optimizing the computation time. The computational cost for sample rate operation can still be given by O(LK) multiplications in each sample n, since the reductions in the computational cost can be by a constant factor.

Exemplary Directional/Spatial Change:

On any change in the orientation of the TX and/or RX device, or in the underlying channel, the spatial-signature vectors $u^{tx}(\theta_{lk}^{tx})$ and/or $u^{rx}(\theta_{lk}^{rx})$ may be recalculated at a cost of $O(LKN_{tx})$ and/or $O(LKN_{rx})$ complex multiplications. Similarly, the effective beamforming gains $\alpha_{lk}^{tx}$ and/or $\alpha_{lk}^{rx}$ may also have to be recalculated at a cost of $O(LKN_{tx})$ and/or $O(LKN_{rx})$ complex multiplications. Further, $\alpha_{lk}$ can be recalculated at a cost of another 1 complex multiplication for each of the LK sub-paths. The total number of complex multiplications can therefore be equal to, e.g., $O(LK(2N_{tx}+2N_{rx}+1))$. However, this operation can take place very infrequently—only when the directions of the TX/RX devices change, or when the underlying channel changes.

Exemplary Beamforming Directions Change:

When the beamforming directions chosen by the TX and/or RX devices change, the value of $\alpha_{lk}^{tx}$ and/or $\alpha_{lk}^{rx}$ may need to be recalculated, at a cost of $N_{tx}$ and/or $N_{rx}$ complex multiplications for each of the LK sub-paths. The resulting $\alpha_{lk}$ may also need to be recalculated using one complex multiplication for each of the LK sub-paths. The total number of complex multiplications can therefore be equal to $O(LK(N_{tx}+N_{rx}+1))$. This operation needs to be performed infrequently—only when the beamforming vectors change.

The discussion above focuses on the case where the transceivers at the transmitter and receiver side perform analog beamforming, meaning that they can "look" in one direction at a time. The exemplary emulator can be extended to hybrid beamforming as well, where the transmitter and/or receiver can "look" in a plurality of spatial directions at the same time. Consider the case where the number of such spatial streams at the transmitter and receiver can be equal to $m_{tx}$ and $m_{rx}$, respectively. In this exemplary case, the input data signal to the emulator s[n] can be a vector of size $m_{tx}$; the output data signal from the emulator r[n] can be a vector of size $m_{rx}$; the beamforming coefficients contained in the control signals $w^{tx}$ and $w^{rx}$ can be matrices of dimension $m_{tx} \times N_{tx}$ and $m_{rx} \times N_{rx}$, respectively; the computational cost of the emulator for sample rate operations can therefore be increased by an asymptotic value of $O(m_{tx}+m_{rx})$, yielding $O(LK(m_{tx}+m_{rx}+2))$ multiplications at each sample n.

The exemplary input data signals s[n] and exemplary output data signals r[n] can be in analog/digital baseband, IF, or RF. Additional conversion stages can be beneficial to convert the signals between IF/RF and baseband, in order to perform the digital signal processing. The data signals can also be represented in frequency domain or an alternate transform domain. Additional domain-conversion steps can be utilized (e.g., FFT/IFFT operations), along with the increased computational cost of these domain-conversion operations.

In full MIMO emulation, the computational cost can be as high as $O(LK(N_{tx}+N_{rx}+2))$ multiplications on each sample n. In the exemplary emulation of the beamformed channel (e.g., assuming analog beamforming), the computational cost can be as high as O(LK) multiplications on each sample n. In typical cluster/tapped-delay-line models, the value of K can be quite large (e.g., 32); this means that a large amount of digital signal processing hardware can be needed to process the emulation, especially for systems that operate at very high sample rates. The present disclosure can achieve computational simplification that can reduce the computational cost by an asymptotic factor of O(K) multiplications on each sample n.

Exemplary Average cluster gain $a_l$:

Such exemplary terms can depend on the beamforming weights and a single AoA and AoD for the cluster, as opposed to the AoAs and AoDs for all the K sub-paths in the cluster. This exemplary term can additionally depend on the radiation patterns of each element of the array, as well as on the errors in the beam-forming phases. Thus, the exemplary terms $\alpha_l$ can be updated rapidly on any beamforming change.

Exemplary Small-Scale Fading Gain $b_l$:

These exemplary terms can depend on the angular spread within each cluster and can be updated at the Doppler rate, which can change relatively infrequently. This exemplary term can additionally depend on the phase noise or frequency offsets in the RF front-ends being emulated. These exemplary terms $b_l$ do not change with the beamforming weights.

The exemplary decomposition can be derived as follows: First, the inner products in Eq. (3) can be approximated as for example:

$$\alpha_{lk}^{rx} \approx \bar{\alpha}_l^{rx} = w^{rx} \cdot u^{rx}(\bar{\theta}_l^{rx}) \tag{4}$$

$$\alpha_{lk}^{tx} \approx \bar{\alpha}_l^{tx} = w^{tx} \cdot u^{tx}(\bar{\theta}_l^{tx}) \tag{5}$$

where $\bar{\theta}_l^{rx}$ and $\bar{\theta}_l^{tx}$ can be the central angles of arrival and departure of the cluster l. This approximation can be valid when the angular spread within each cluster can be small, which can be typical in most wireless CDL/TDL models. If the angular spread of the cluster can be large, then the cluster can be divided into multiple clusters each having a small angular spread. Defining the complex gain of the cluster as $\bar{\alpha}_l = \bar{\alpha}_l^{rx} \cdot \bar{\alpha}_l^{tx}$, and plugging this into Eq. (2), can produce, for example, the following:

$$r[n] = \sum_{\ell=1}^{L} \sum_{k=1}^{K} \sqrt{\frac{P_\ell}{K}} e^{-i2\pi f_{\ell k} n} \bar{\alpha}_\ell s[n-\tau_\ell] \tag{6}$$

$$r[n] = \sum_{\ell=1}^{L} e^{-i2\pi \bar{f}_\ell n} \sqrt{P_\ell} \, \bar{\alpha}_\ell \sqrt{\frac{1}{K} \sum_{k=1}^{K} e^{-i2\pi (f_{\ell k} - \bar{f}_\ell) n}} s[n-\tau_\ell] \tag{7}$$

$$r[n] = \sum_{\ell=1}^{L} e^{-i2\pi \bar{f}_\ell n} \cdot a_\ell \cdot b_\ell \cdot s[n-\tau_\ell] \tag{8}$$

where $a_l$ can be the average cluster gain of cluster l, and $b_l$ can be the small-scale fading gain of the cluster l. These values can be defined, for example:

$$a_\ell = \sqrt{P_\ell} \, \bar{\alpha}_\ell \tag{8A}$$

$$b_\ell = \sqrt{\frac{1}{K} \sum_{k=1}^{K} e^{-i2\pi (f_{\ell k} - \bar{f}_\ell) n}} \tag{8B}$$

The exemplary small-scale fading gain $b_l$ value can change only in accordance with the Doppler spread of the paths, which can occur infrequently relative to the sample rate of the emulator. This exemplary value may not capture the Doppler shift of the cluster by itself, but it does capture the small-scale fading caused by the Doppler spread within the cluster. The exemplary rotating complex phasor in Eq. (8) can rotate at a much higher rate than the ones used to calculate the small-scale fading gain $b_l$. (See, e.g., Eq. (8B)). Therefore, the exemplary values of $\alpha_l$ and $b_l$ can be kept constant in the sample rate implementation of Eq. (8). The exemplary values can be updated infrequently, due to the small values of Doppler spread within each cluster, and the changes in the underlying channel and/or beamforming directions and/or device orientation.

Figure 5:
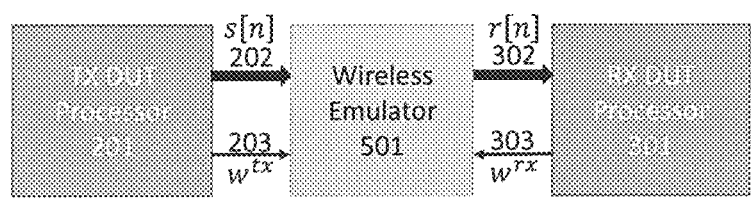
FIGS. 5 and 6 are exemplary diagrams of a system-level views illustrating how devices under test interface with the exemplary emulator according to exemplary embodiments of the present disclosure.
Figure 6:
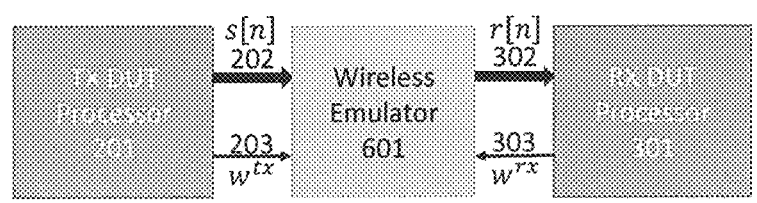

FIGS. 5 and 6 show exemplary diagrams of system-level views illustrating how devices under test interface with the exemplary emulator according to an exemplary embodiment of the present disclosure. As shown in FIGS. 5 and 6, the processor 201 can transmit the pre-beamformed data signal(s) 202 to wireless emulators 501 and 601, respectively. This can result in post-beamformed data signal(s) 302 being sent to the processor 301. The processor 201 can also transmit the control signal(s) 203 to wireless the emulators 501 and 601, which can transmit the control signal(s) 303 to the processor 301. Wireless emulator 501 (e.g., as shown in FIG. 5) can be used to emulate the wireless channel and beamforming operations through Eq. (2). Wireless emulator 601 (e.g., as shown in FIG. 6) can be used to emulate the wireless channel and beamforming operations through Eqs. (8) and (9). Signals, 202, 203, 302 and 303 can have the attributes as described above.

Figure 7A:
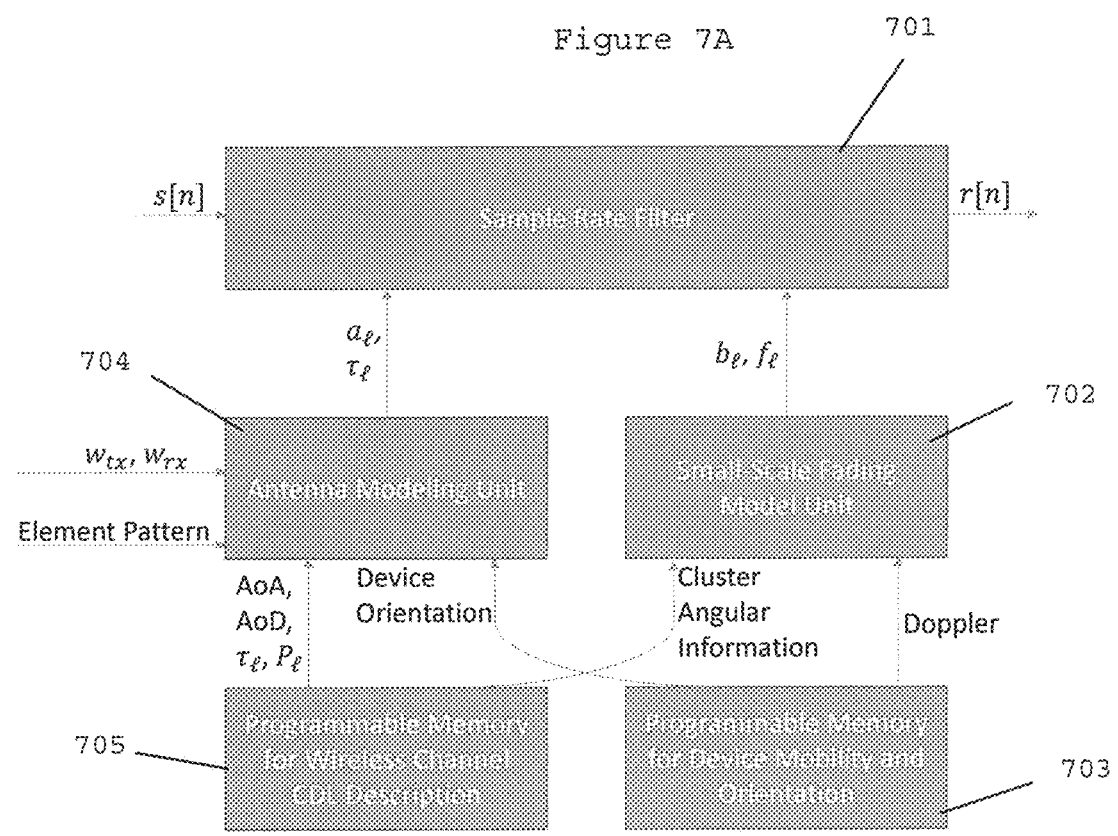
FIG. 7A is an exemplary block diagram of an exemplary apparatus for implementing the exemplary emulation system according to an exemplary embodiment of the present disclosure.

FIG. 7A shows an exemplary block diagram of an exemplary apparatus used to implement the exemplary emulation system according to an exemplary embodiment of the present disclosure. As shown in FIG. 7A, the exemplary emulator can include a sample rate filter 701 which can obtain or otherwise receive the input pre-beamformed TX data signal and output the post-beamformed RX data signal by combining the average cluster gains, small-scale fading gains and delay of each cluster. For example, the sample rate filter can implement Eq. (8).

A programmable small-scale fading model unit 702 can be used to compute, for each cluster, a complex fading gain based on the cluster information and information on the TX or RX direction and/or speed of motion. For example, in emulating Eq. (8), the small-scale fading model unit 702 can compute the Doppler shifts $f_{kl}$ from the direction and speed of motion relative to the AoA and AoD of each sub-path k and cluster l. Then, the small-scale fading model unit 702 can compute the fading gain from Eq. (8B). The small-scale fading model unit 702 can be programmed and/or fixed over the course of the emulation, or updated during the emulation to model changes in the DUT orientation or translational motion.

The exemplary emulator can include a programmable memory for Device Mobility and Orientation 703. This exemplary functionality can include, e.g., a translational motion in the environment, along with the rotation of the device in both elevation and azimuth. The programmable memory for Device Mobility and Orientation 703 can be programmed and fixed over the course of the emulation, or updated based on the desired mobility and orientation profile.

The exemplary emulator can include one or more programmable antenna modeling units 704 for the exemplary TX and/or RX DUTs. For each cluster, the exemplary antenna modeling units 704 can combine the wireless channel cluster information with the beamforming control to produce an average cluster gain. The exemplary antenna modeling units 704 can be programmed and/or fixed over the course of the emulation or updated during the emulation to model changes in the DUT orientation, underlying channel, or beamforming coefficients.

The exemplary emulator can include a programmable memory for Wireless Channel CDL/TDL description 705. The description of the wireless channel can include some characteristics of each cluster. The characteristics can include a power, delay, central AoAs, AoDs, as well as the angular spread. For example, the exemplary programmable memory for Wireless Channel CDL/TDL description 705 can include the terms $P_l$, $T_l$, . . . described above. Alternatively or in addition, each cluster can be defined by a set of rays with individual angles and power. In this exemplary case, the central angles and angular spread can be inferred. The exemplary programmable memory for Wireless Channel CDL/TDL description 705 can be programmed and/or fixed over the course of the emulation, or updated to model large-scale changes in the wireless channel.

The exemplary emulator can receive input pre-beamformed data signals s[n] from the exemplary TX DUT, and output post-beamformed data signals r[n] to the exemplary RX DUT. These exemplary data signals can be transmitted via digital baseband samples s[n] from the TX DUT and r[n] to the RX DUT. However, the input data signals to the emulator and/or the output data signals from the emulator can also be in analog at baseband, IF or RF with appropriate conversion being performed in the emulator. These exemplary data signals can also be represented in the frequency-domain or an alternate transform domain, as indicated herein.

The exemplary emulator can also receive beamforming control signals for the antenna arrays from the exemplary TX and RX DUTs. To implement Eq. (8), the TX and RX beamforming control signals can be represented as beamforming coefficients $w^{tx}$ and $w^{rx}$ respectively. The beamforming control signals can be an index that can select one of the beamforming vectors. These exemplary control signals can also include additional information about gain settings.

The exemplary emulator can also be configured with information about the RF front-ends being emulated. This information can include the radiation patterns of each of the elements in the array, as well as the errors in beamforming (e.g., d degrees RMS beamforming phase error).

Exemplary Spatial Signature Model:

In emulating Eq. (8), the antenna model unit can have a model to compute the spatial signatures $u^{rx}(\overline{\theta}_l^{rx})$ and $u^{tx}(\overline{\theta}_l^{tx})$ given a central AoA $\overline{\theta}_l^{rx}$ and AoD $\overline{\theta}_l^{tx}$. The exemplary model can be or include a look-up table and/or be represented in a parametric form. When the spatial signatures can be computed, the cluster average gain can be computed by combining the beamforming weights $w^{tx}$ and $w^{rx}$ with spatial signatures from $\overline{\alpha}_l = \overline{\alpha}_l^{rx} \cdot \overline{\alpha}_l^{tx}$ where $\overline{\alpha}_l^{rx}$ and $\overline{\alpha}_l^{tx}$ can be computed from Eqs. (4) and (5). The exemplary antenna model can also consider the radiation patterns of each element in the array, as well as the beamforming phase errors.

Exemplary Codebook Radiation Pattern Model:

A finite number of beamforming vectors can be provided, and the beamforming control can indicate the index of which beamforming vector can be used. For each beamforming index, the antenna modeling unit can store the post-beamforming gains $\overline{\alpha}_l^{rx}$ and $\overline{\alpha}_l^{tx}$ as a function of the AoA and AoD. This gain can be the radiated pattern of the antenna array as typically specified by the manufacturer. The beamforming vectors $w^{tx}$ and $w^{rx}$ and spatial signatures $u^{rx}(\overline{\alpha}_l^{rx})$ and $u^{tx}(\overline{\alpha}_l^{tx})$ do not need to be explicitly modeled.

Below are exemplary results of the computational cost of different operations that can be computed based on the exemplary emulator shown in FIG. 7A.

Figure 7C:
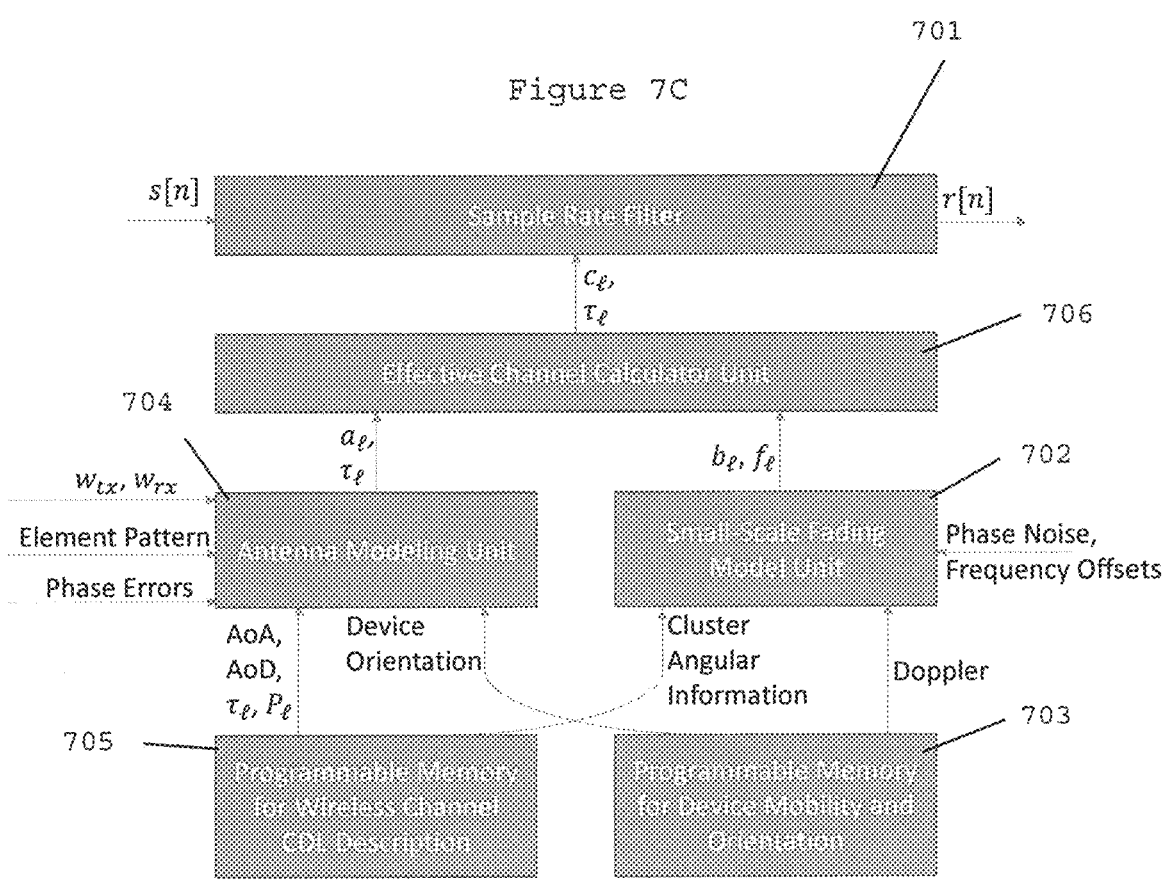
FIG. 7C is an even further exemplary block diagram of an exemplary apparatus for implement the exemplary emulation system according to another exemplary embodiment of the present disclosure.

FIG. 7B shows a further exemplary block diagram of an exemplary apparatus used to implement the exemplary emulation system according to an exemplary embodiment of the present disclosure. As shown in FIG. 7B, the exemplary emulator can include an additional Effective Channel Calculator Unit 706 that can combine the outputs of the antenna modeling unit 704 and the small-scale fading modeling unit 702, and provide the effective channel to the sample rate filter. FIG. 7C illustrates an even further exemplary block diagram of an exemplary apparatus used to implement the exemplary emulation system according to an exemplary embodiment of the present disclosure. As shown in FIG. 7C, the small-scale fading modeling unit 702 can consider an additional input parameter that describes the RF phase noise or frequency offset characteristics of the RF front-end being emulated.

Exemplary Sample Rate Operation:

On each sample n, the sample rate filter in the emulator can implement Eq. (8). (See, e.g., FIG. 6). Each term inside the summation can utilize 3 complex multiplications, noting that the complex exponential can be generated by a rotating complex phasor. Therefore, e.g., the total number of complex multiplications per sample can be O(L), which can be a O(K) reduction in asymptotic computational cost. K (e.g., the number of sub-paths per cluster) can be quite large in the 3GPP models, this can represent a significant improvement in the computational cost. The product of $\alpha_l \cdot b_l$ and the complex rotating phasor can be pre-computed and used in the emulation of Eq. (8), thus providing a further reduction (e.g., by a constant factor) in the number of complex multiplications that need to be performed for each sample, for example, O(L). This is shown in FIGS. 7B and 7C.

Exemplary Directional/Spatial Change:

When the directions of the TX/RX devices change, or when the underlying channel changes, the exemplary antenna modeling unit can recalculate vector $u^{rx}(\overline{\alpha}_l^{rx})$ and/or $u^{tx}(\overline{\alpha}_l^{tx})$ at a cost of $O(LN_{tx})$ and/or $O(LN_{rx})$ complex multiplications. Similarly, the effective beamforming gains $\overline{\alpha}_l^{rx}$ and/or $\overline{\alpha}_l^{tx}$ can also be recalculated at the cost of $O(LN_{tx})$ and/or $O(LN_{rx})$ complex multiplications (see, e.g., Eq. (3)). $\alpha_l$ and $\alpha_l$ can be recalculated at the cost of at most another 2 complex multiplications for each of the L clusters (see, e.g., Eqs. (4), (5) and (8A)). The total number of complex multiplications can therefore be equal to $O(L(2N_{tx}+2N_{rx}+2))$. However, this exemplary operation can take place relatively infrequently—only when the directions of the TX/RX devices change, or when the underlying channel changes.

Further, when the directions of the exemplary TX/RX devices change, or when the channel spatial directions change, the small-scale fading modeling unit can be updated based on the new information about cluster angular spread and Doppler, so that the subsequently scheduled updates $b_l$ can reflect the new spatial directions and orientations. Upon changes in device orientation of spatial directions, e.g., the $b_l$ values do not need to be immediately updated, since the underlying changes can be small, and may not affect the instantaneous small-scale fading gain $b_l$.

The overall number of complex multiplications needed can be $O(L(2N_{tx}+2N_{rx}+2))$. This can represent a significant reduction.

Exemplary Beamforming Direction Change:

When the control signals containing the beamforming vectors change, the $\alpha_l^{rx}$ and $\alpha_l^{tx}$ values can change at a total cost of $O(L(N_{tx}+N_{rx}))$ complex multiplications. (See, e.g., Eq. (3)). The $\alpha_l$ and subsequently the $\alpha_l$ values can also be updated at the cost of O(2L) complex multiplications. Therefore, the total cost can be $O(L(N_{tx}+N_{rx}+2))$ complex multiplications. As described above, these updates can be infrequent, relative to the sample rate of the Emulator.

The exemplary devices can issue these beamforming control signals in advance, and can then issue a trigger to apply these new beamforming directions. This can be beneficial to meet the timing requirements of the Emulator reflecting the new beamforming directions as quickly as possible. The beamforming control signals can contain a time-stamp at which such triggering can take place within the Emulator.

The exemplary system/method can utilize intermittently updates of the $b_l$ terms to, depending on the Doppler spread within the cluster. Larger Doppler spreads can indicate that the $b_l$ values can be updated more quickly. Based on typical Doppler spreads within a cluster, the maximum expected update interval for $b_l$ can be on the order of 100 microseconds. This can take O(LK) steps for a full re-calculation, but this can be performed infrequently, relative to the sample rate of the Emulator.

The intermittent re-calculation of the $b_l$ terms can utilize a computation that can be independent of the number of antennas $N_{tx}$ and $N_{rx}$.

The exemplary emulator according to an exemplary embodiment of the present disclosure, can implement Eq. (8) as discussed herein, at a computational cost of O(L). However, this computational cost can be further optimized by a constant factor. In one example, the emulator can implement Eq. (9) below:

$$r[n] = \sum_{l=1}^{L} c_l \cdot s[n - \tau_l] \quad (9)$$

where $c_l = e^{-i2\pi f_l n} \cdot \alpha_l \cdot b_l$. This equation can also be implemented at a computational cost of just O(L), but there can be a reduction in computational cost by a constant factor of 3, where the emulator implements Eq. (8) on each sample. The value of $c_l$ can change very infrequently, relative to the sample rate of the emulator. Specifically, when the value of $\alpha_l$, $b_l$ or $e^{-i2\pi f_l n}$ changes, the $c_l$ term can be re-calculated and used in the emulation. These are illustrated in FIGS. 7B and 7C. The implementation of Eq. (8) can be optimized in many different ways, depending on how frequently the values of $\alpha_l$, $b_l$ or $e^{-i2\pi f_l n}$ change.

The data signals s[n] and r[n] can be in baseband, IF, or RF. Furthermore, the exemplary description above focuses on the case where the transceivers at the transmitter and receiver side perform analog beamforming. For hybrid beamforming, the number of such spatial streams at the transmitter and receiver can be considered which can be equal to $m_{tx}$ and $m_{rx}$ respectively. In this exemplary case, the input data signal to the emulator s[n] can be a vector of size $m_{tx}$; the output data signal from the emulator can be a vector of size $m_{rx}$; the beamforming coefficients (e.g., control signals) $w^{tx}$ and $w^{rx}$ can be matrices of dimension $m_{tx} \times N_{tx}$ and $m_{rx} \times N_{rx}$ respectively; the computational cost of the emulator can therefore be increased by an asymptotic value of $O(m_{tx}+m_{rx})$.

Exemplary Application of the Present to Full MIMO Emulation and Heterogeneous Operation The exemplary system can be used with devices that perform digital beamforming as well (e.g., the beamforming can be done by the DUT itself, as opposed to being emulated). A transmitter device that employs digital beamforming can have $m_{tx}=N_{tx}$, and the implied beamforming matrix, can be an identity matrix. Similarly, a receiver device that employs digital beamforming can have $m_{rx}=N_{rx}$, and the implied beamforming matrix can be an identity matrix. Thus, the exemplary system can facilitate simplified emulation to be performed irrespective of whether the beamforming is emulated or is performed by the DUTs themselves. The emulation of a link, regardless of whether the beamforming procedures used on the transmitter and receiver side are similar to, or different from, each other. Examples of such embodiments are shown below, along with the computational cost in the sample rate filter, that can be performed for each sample n.

- TX: Analog, RX: Analog. Cost: O(L)
- TX: Analog, RX: Hybrid. Cost: $O(L(m_{rx}))$
- TX: Analog, RX: Digital. Cost: $O(L(m_{rx}))$, which is the same as $O(L(N_{rx}))$
- TX: Hybrid: RX: Analog. Cost: $O(L(m_{tx}))$
- TX: Hybrid: RX: Hybrid. Cost: $O(L(m_{tx}+m_{rx}))$
- TX: Hybrid: RX: Digital. Cost: $O(L(m_{tx}+m_{rx}))$, which is the same as $O(L(m_{tx}+N_{rx}))$
- TX: Digital: RX: Analog. Cost: $O(L(m_{tx}))$, which is the same as $O(L(N_{tx}))$
- TX: Digital: RX: Hybrid. Cost: $O(L(m_{tx}+m_{rx}))$, which is the same as $O(L(N_{tx}+m_{rx}))$
- TX: Digital: RX: Digital (this is full MIMO Emulation). Cost: $O(L(m_{tx}+m_{rx}))$, where $m_{tx}=N_{tx}$ and $n_{rx}=N_{rx}$.

Figure 8A:
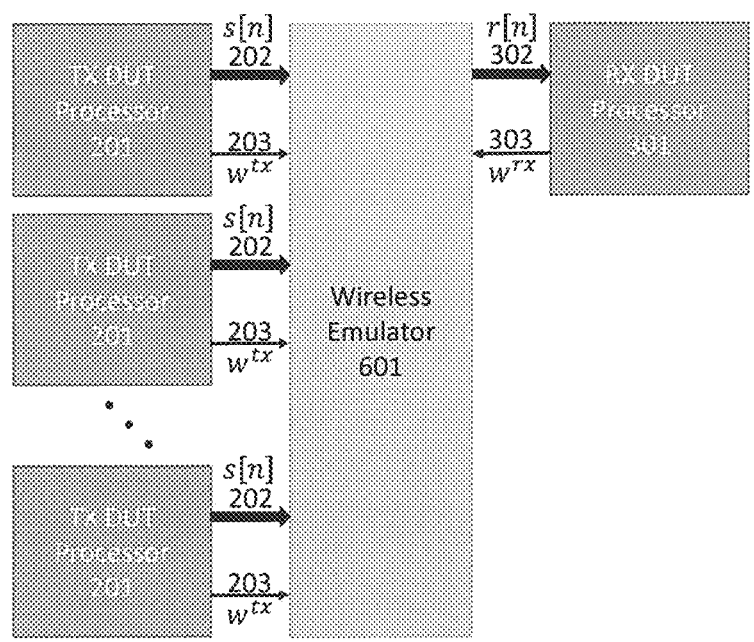
FIG. 8A is an exemplary block diagram of the exemplary apparatus where more than one transmitter device supplies signals to the exemplary emulator according to yet another exemplary embodiment of the present disclosure.
Figure 8B:
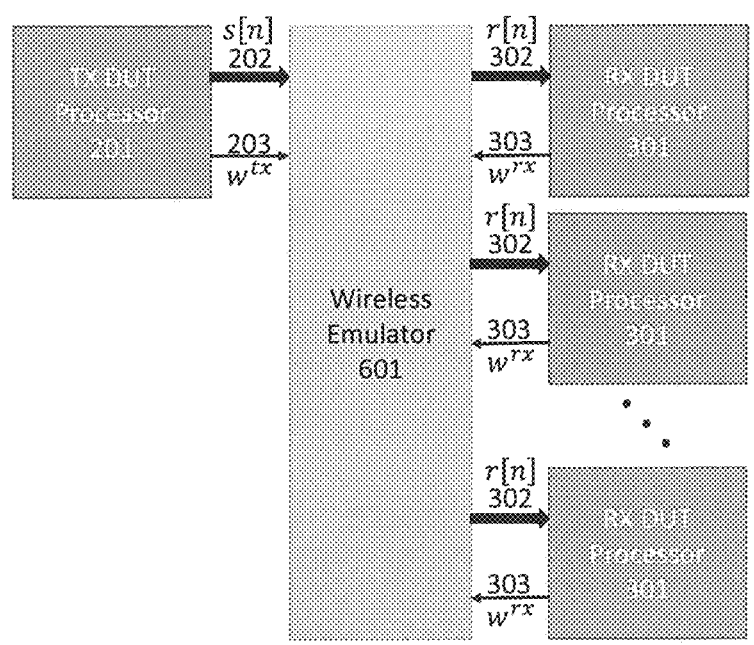
FIG. 8B is an exemplary block diagram of the exemplary apparatus where more than one receiver receives signals from the exemplary emulator according to an exemplary embodiment of the present disclosure.

FIG. 8A shows an exemplary block diagram where more than one transmitter device 201 supplies signals to the emulator 601 according to an exemplary embodiment of the present disclosure. FIG. 8B shows an exemplary schematic diagram where more than one receiver 301 receives signals from the emulator 601 according to an exemplary embodiment of the present disclosure.

Figure 8C:
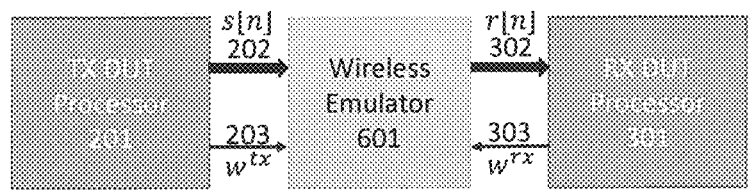
FIG. 8C is an exemplary block diagram where the transmitter device has multiple front-ends that are emulated by the exemplary emulator according to an exemplary embodiment of the present disclosure.

FIG. 8C shows an exemplary block diagram in which the exemplary transmitter device 201 has multiple front-ends that are emulated by emulator 601 according to an exemplary embodiment of the present disclosure. The exemplary transmitter device 201 can select which subset of these front-ends being active at any time. In the exemplary case in which there is one active RF front-end to emulate, the exemplary signal 203 can include information on which one of the RF front-ends are active, along with the beamforming coefficients $w^{tx}$. In the exemplary case in which there are multiple active RF front-ends to emulate, the exemplary signal 203 can contain information on which subset of RF front-ends are active, along with the beamforming coefficients $w^{tx}$ for each of these active RF front-ends. The exemplary signal 202 can contain either the same data signal s[n] or different data signals s[n] to each of the emulated RF front-ends.

Figure 8D:
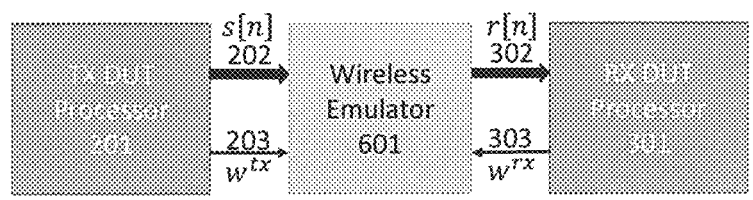
FIG. 8D is a block diagram where a receiver device can select which subset of these front-ends can be active at any time according to an exemplary embodiment of the present disclosure.

FIG. 8D shows a block diagram where the exemplary receiver device 301 can select which subset of these front-ends can be active at any time according to an exemplary embodiment of the present disclosure. In the exemplary case in which there is one active RF front-end to emulate, the exemplary signal 303 can include information on which one of the RF front-ends are active, along with the beamforming coefficients $w^{rx}$. In the exemplary case in which there are multiple active RF front-ends to emulate, the exemplary signal 303 can contain information on which subset of RF front-ends are active, along with the beamforming coefficients $w^{rx}$ for each of these active RF front-ends. The exemplary signal 302 can contain the same data signal r[n] for each of the active RF front-ends.

Figure 8E:
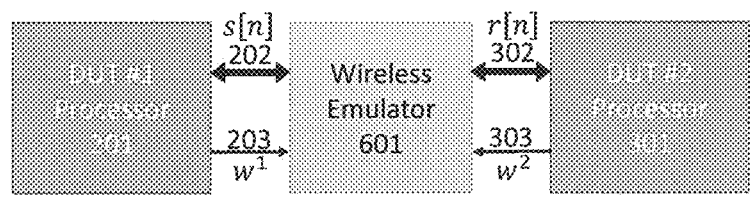
FIG. 8E is an exemplary block diagram illustrating bi-directional link operation, according to an exemplary embodiment of the present disclosure.

FIG. 8E shows an exemplary block diagram illustrating bi-directional link operation, which can be implemented in half-duplexed mode where DUT #1 201 is in transmit/receive mode, and DUT #2 301 is in receive/transmit mode or full-duplex mode according to an exemplary embodiment of the present disclosure. A Triggered operation, where the beamforming coefficients can be issued by the transmitter and receiver ahead of time, and a "trigger" or timed command, can be issued for the emulator to reflect the new equivalent channel taps. The control signals can contain other information, e.g., in addition to the beamforming coefficients. Examples can include, but not limited to: gain settings, attenuation settings, carrier frequency, temperature of operation, noise figures.

As discussed herein, the exemplary device for emulation or simulation of a wireless channel can include, for example, an interface that can receive data signals from a transmitter device under test (e.g., TX DUT) and outputs data signals to a receiver device under test (e.g., RX DUTs). An interface can receive control signals from the TX and/or the RX DUTs. A programmable memory can be used for storing configuration information that can describe a cluster delay line ("CDL") or tapped delay line ("TDL") wireless channel to emulate, where the description can include information on the delay, angular spread, central angle of arrival ("AoA") and central angle of departure ("AoD") for each cluster.

The programmable memory can be used for storing configuration information on the motion and/or orientation of the TX and/or RX DUTs to be modeled. An antenna modeling unit can be used to compute, for each cluster, first information based on the control signal inputs, cluster AoA and AoD, and configurable information on the antennas to be modeled. A fading computing unit can be used to compute or otherwise determine, for each cluster, second information based on the Doppler shifts within the cluster, which can be calculated from configuration information from the programmable memory that can include the angular spread within the cluster, and the motion and/or orientation of the exemplary TX DUTs and/or the exemplary RX DUTs. A sample rate filter can accept input data signals, modify them in accordance with the delays and the first and second calculated information terms of each cluster, and output the resulting data signal.

The exemplary emulation device can be configured to receive a portion of the control signals from the wireless transmitter and the wireless receiver from one or more. Control signals from the wireless transmitters and wireless receivers can include data relating to beamforming weights or precoding matrices for a plurality of antennas. The control signals related to the wireless transmitters and wireless receivers can include data relating to a gain control or polarization for one or more antennas. The configuration information related to the wireless transmitters and wireless receivers can include data relating to a placement or an orientation or radiated beam pattern for one or more antennas. The configuration information related to the wireless channel can include parameters relating to a channel impulse response.

In some exemplary embodiments of the present disclosure, the configuration information can include parameters relating to a mobility of the wireless transmitters or wireless receivers. The configuration information can include parameters relating to the carrier frequency of the emulated system. The format of the input signals to the emulation processor can be time-domain analog baseband, time-domain digital baseband, time-domain intermediate frequency, time-domain radio frequency, frequency-domain digital baseband, or an alternate transform domain. The format of the output signals from the emulation processor can be time-domain analog baseband, time-domain digital baseband, time-domain intermediate frequency, time-domain radio frequency, frequency-domain digital baseband, or an alternate transform domain. The sample rate filter can include a plurality of programmable finite impulse response ("FIR") filters. The device can program the plurality of programmable FIR filters to emulate the following types of channels for each of the plurality of paths comprising the wireless channel: (i) Single input single output ("SISO"), (ii) Single input multiple output ("SIMO"), (iii) Multiple input single output ("MISO"), or (iv) Multiple input Multiple output ("MIMO"). The emulator can receive updated configuration information relating to the wireless channel, the wireless transmitter, and the wireless receiver; and configure the sample rate filter to operate according to the updated configuration without substantially affecting the substantially real-time operation. A small-scale fading unit can periodically or intermittently re-configure the sample rate filter with updated emulation parameters in accordance with the previously or newly received configuration information.

In certain exemplary embodiments of the present disclosure, the AoA and AoD values for each cluster can be specified for azimuth and elevation/zenith. The AoA and AoD values for each cluster can be specified in polar coordinates. The wireless transmitter can have more than one RF front-end to be emulated. The wireless receiver can have more than one RF front-end to be emulated. One of the exemplary DUTs can operate both as a transmitter and as a receiver. The control signals from the transmitter or the receiver device can include a trigger or a timing information for the application of the beamforming emulation. The control signals from the transmitter or the receiver can include information pertaining to gain settings, attenuation settings, carrier frequency, temperature of operation, and/or noise figure. The configuration information related to the wireless transmitter can relate to analog beamforming, hybrid beamforming, or digital beamforming. The configuration information related to the wireless receiver can relate to analog beamforming, hybrid beamforming, or digital beamforming.

Figure 9:
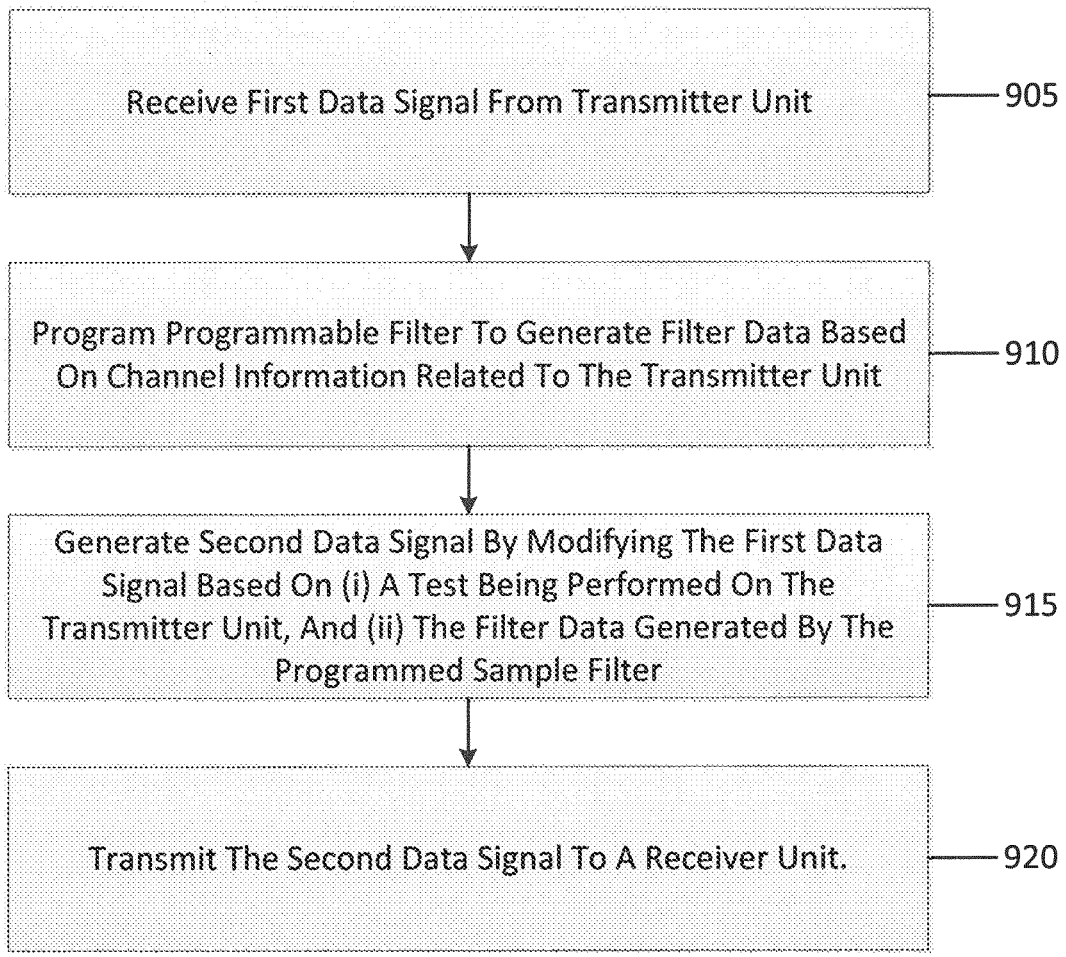
FIG. 9 is an exemplary flow diagram of an exemplary method for emulating a wireless channel according to an exemplary embodiment of the present disclosure.

FIG. 9 shows an exemplary flow diagram of an exemplary method 900 for emulating a wireless channel according to an exemplary embodiment of the present disclosure. For example, at procedure 905, a first data signal from a transmitter unit can be received. At procedure 910, a programmable filter can be programmed to generate filter data based on channel information related to the transmitter unit. At procedure 915, a second data signal can be generated by modifying the first data signal based on a test being performed on the transmitter unit and the filter data generated by the programmable sample filter. At procedure 920, the second data signal can be transmitted to a receiver unit.

Figure 10:
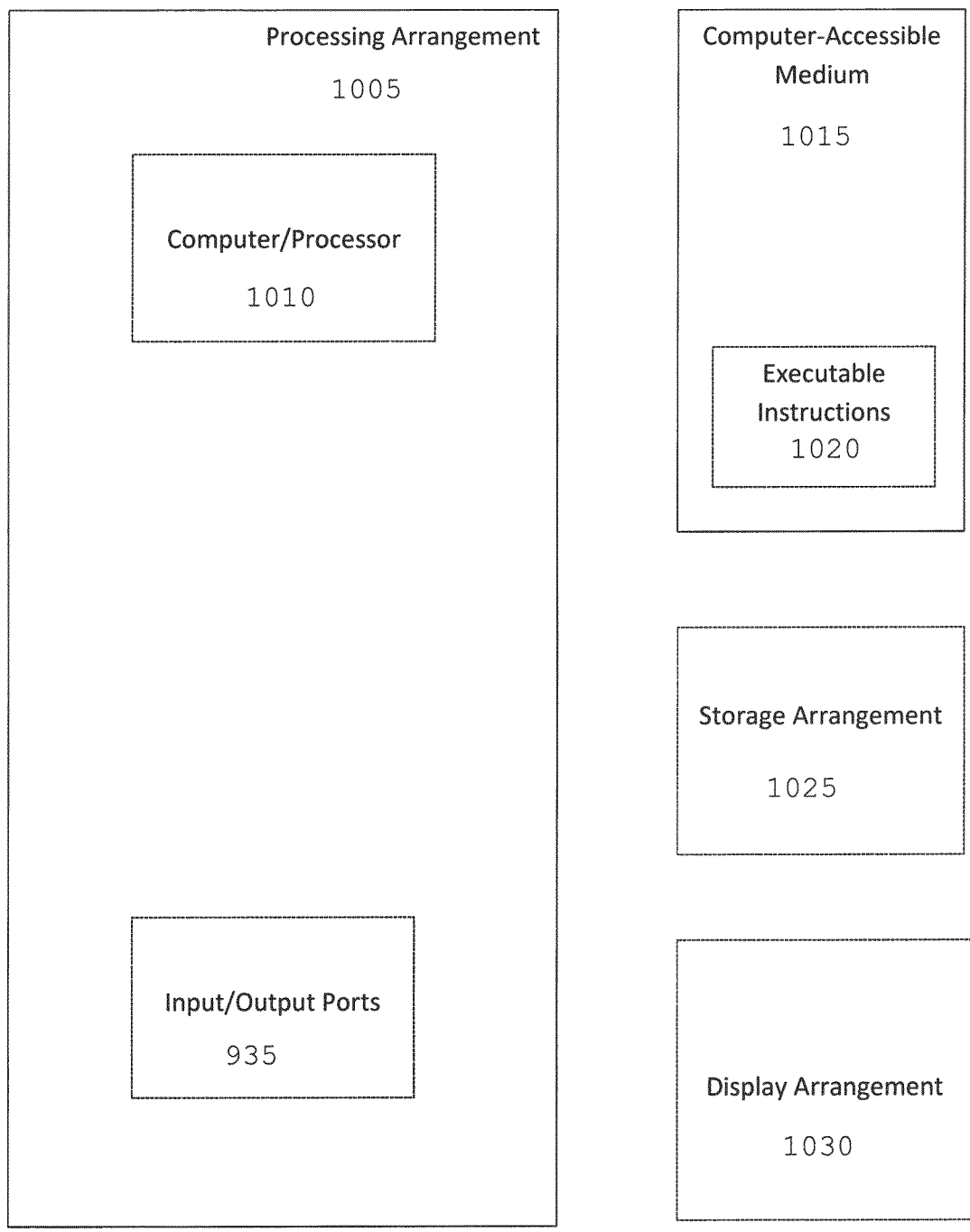
FIG. 10 is an illustration of an exemplary block diagram of an exemplary system in accordance with certain exemplary embodiments of the present disclosure.

FIG. 10 shows a block diagram of an exemplary embodiment of a system according to the present disclosure. For example, exemplary procedures in accordance with the present disclosure described herein can be performed by a processing arrangement and/or a computing arrangement 1005. Such processing/computing arrangement 1005 can be, for example entirely or a part of, or include, but not limited to, a computer/processor 1010 that can include, for example one or more microprocessors, and use instructions stored on a computer-accessible medium (e.g., RAM, ROM, hard drive, or other storage device).

As shown in FIG. 10, for example a computer-accessible medium 1015 (e.g., as described herein above, a storage device such as a hard disk, floppy disk, memory stick, CD-ROM, RAM, ROM, etc., or a collection thereof) can be provided (e.g., in communication with the processing arrangement 1005). The computer-accessible medium 1015 can contain executable instructions 1020 thereon. In addition, or alternatively, a storage arrangement 1025 can be provided separately from the computer-accessible medium 1015, which can provide the instructions to the processing arrangement 1005 so as to configure the processing arrangement to execute certain exemplary procedures, processes, and methods, as described herein above, for example.

Further, the exemplary processing arrangement 1005 can be provided with or include an input/output ports 1035, which can include, for example a wired network, a wireless network, the internet, an intranet, a data collection probe, a sensor, etc. As shown in FIG. 10, the exemplary processing arrangement 1005 can be in communication with an exemplary display arrangement 1030, which, according to certain exemplary embodiments of the present disclosure, can be a touch-screen configured for inputting information to the processing arrangement in addition to outputting information from the processing arrangement, for example. Further, the exemplary display arrangement 1030 and/or a storage arrangement 1025 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

What is claimed is:

1. A device for emulating at least one wireless channel, comprising:
   a first communication interface configured to receive at least one first data signal from at least one transmitter unit;
   a hardware processor configured to:
      receive the at least one first data signal from the first communication interface, and
      generate at least one second data signal by modifying the at least one first data signal based on at least one test being performed on the at least one transmitter unit;

a second communication interface configured to receive the at least one second data signal from the hardware processor, and transmit the at least one second data signal to at least one receiver unit; and at least one control interface configured to:
- receive at least one control signal from at least one of the at least one transmitter unit or the at least one receiver unit, and
- provide the at least one control signal to the hardware processor to determine the at least one second data signal, wherein the at least one control signal includes beamforming weights.

2. The device of claim 1, further comprising at least one antenna modeling unit configured to determine, based on the at least one control signal, at least one of (i) one or more cluster angles of arrival from the at least one transmitter unit, or (ii) one or more cluster angles of departure for the at least one receiver unit.

3. The device of claim 1, wherein the at least one control signal further includes at least one of (i) precoding matrices for a plurality of antennas, (ii) a gain control, or (iii) a polarization for the plurality of antennas.

4. The device of claim 1, further comprising at least one programmable memory apparatus configured to store particular information thereon related to at least one of (i) a cluster delay line between the at least one transmitter unit and the at least one receiver unit to emulate, or (ii) a tapped delay line between the at least one transmitter unit and the at least one receiver unit to emulate.

5. The device of claim 4, wherein the particular information includes at least one of (i) a signal delay, (ii) an angular spread, (iii) a central angle of arrival, or (iv) a central angle of departure.

6. The device of claim 4, wherein the particular information includes at least one of (i) a placement of at least one antenna, (ii) an orientation of the at least one antenna, or (iii) a radiated beam pattern of the at least one antenna.

7. The device of claim 4, wherein the particular information includes at least one of (i) a motion or (ii) an orientation of at least one of (i) the at least one transmitter unit, or (ii) the at least one receiver unit.

8. The device of claim 4, wherein the particular information includes at least one of (i) a channel impulse response, (ii) a mobility of at least one of the at least one transmitter unit or the at least one receiver unit, or (iii) a carrier frequency of the wireless channel.

9. The device of claim 1, further comprising at least one fading computing unit configured to determine a Doppler shift for each cluster of signals between the at least one transmitter unit and the at least one receiver unit.

10. The device of claim 9, wherein the at least one fading computing unit is configured to determine the Doppler shift based on at least one of (i) an angular speed within each cluster of signals, (ii) a motion of at least one of the at least one transmitter unit or the at least one receiver unit, or (iii) an orientation of at least one of the at least one transmitter unit or the at least one receiver unit.

11. The device of claim 1, wherein:
the at least one first data signal has a form of one of (i) a time-domain analog baseband, (ii) a time-domain digital baseband, (iii) a time-domain intermediate frequency, (iv) a time-domain radio frequency, or (v) a frequency-domain digital baseband; and
the at least one second data signal has a form of one of (i) the time-domain analog baseband, (ii) the time-domain digital baseband, (iii) the time-domain intermediate frequency, (iv) the time-domain radio frequency, or (v) the frequency-domain digital baseband.

12. The device of claim 1, wherein the hardware processor is configured to generate the at least one second data signal using at least one sample filter.

13. The device of claim 12, wherein the at least one sample filter includes a plurality of programmable finite impulse response (FIR) filters.

14. The device of claim 13, wherein the hardware processor is further configured to program the plurality of programmable FIR filter to emulate at least one particular type of channel.

15. The device of claim 14, wherein the at least one particular type of channel includes at least one of (i) a Single input single output, (ii) a Single input multiple output, (iii) a Multiple input single output, or (iv) a Multiple input Multiple output.

16. A device for emulating at least one wireless channel, comprising:
a first communication interface configured to receive at least one first data signal from at least one transmitter unit;
at least one programmable memory apparatus configured to store particular information related to at least one cluster of signals;
at least one programmable sample filter providing filter data associated with the at least one first data signal;
a hardware processor configured to:
- receive (i) the at least one first data signal from the first communication interface, and (ii) the particular information,
and
- generate at least one second data signal by modifying the at least one first data signal based on (i) at least one test being performed on the at least one transmitter unit, and (ii) the filter data provided by the at least one programmable sample filter;

a second communication interface configured to receive the at least one second data signal from the hardware processor, and transmit the at least one second data signal to at least one receiver unit; and at least one control interface configured to:
- receive at least one control signal from at least one of the at least one transmitter unit or the at least one receiver unit, and
- provide the at least one control signal to the hardware processor to determine the at least one second data signal, wherein the at least one control signal includes beamforming weights.

17. The device of claim 16, wherein the hardware processor is further configured to program the at least one programmable sample filter to emulate at least one particular type of channel prior to generating the at least one second data signal.

18. A method for emulating at least one wireless channel, comprising:
receiving at least one first data signal from at least one transmitter unit;
receiving at least one control signal from at least one of the at least one transmitter unit or at least one receiver unit, wherein the at least one control signal includes beamforming weights;
programming at least one programmable filter to generate filter data based on channel information related to the at least one transmitter unit;

determining at least one second data signal by modifying the at least one first data signal based on (i) at least one test being performed on the at least one transmitter unit, (ii) the filter data generated by the at least one programmed sample filter, and (iii) the at least one control signal; and transmitting the at least one second data signal to the at least one receiver unit.

19. The method of claim 18, wherein the generating of the at least one second data signal is further based on information related to a cluster of signals stored in a programmable memory.

* * * * *